(12) United States Patent
Kajimoto

(10) Patent No.: US 6,456,563 B1
(45) Date of Patent: Sep. 24, 2002

(54) SEMICONDUCTOR MEMORY DEVICE THAT OPERATES IN SYCHRONIZATION WITH A CLOCK SIGNAL

(75) Inventor: Takeshi Kajimoto, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/983,632

(22) Filed: Oct. 25, 2001

(30) Foreign Application Priority Data

May 18, 2001 (JP) ........................................ 2001-148702

(51) Int. Cl.⁷ ................................................. G11C 8/00
(52) U.S. Cl. ................................... 365/233; 365/189.04
(58) Field of Search ............................. 365/233, 189.04, 365/189.05, 189.12, 194, 230.06, 230.08, 189.09

(56) References Cited

U.S. PATENT DOCUMENTS 6,262,936 B1 * 7/2001 Arcoleo et al. ........ 365/189.04

FOREIGN PATENT DOCUMENTS

JP  7-326189  12/1995
JP  10-199240  7/1998

* cited by examiner

Primary Examiner—David Lam
(74) Attorney, Agent, or Firm—McDermott, Will & Emery

(57) ABSTRACT

An SDRAM is provided with a delay circuit for delaying for a certain time period a signal that attains an active level in response to an active command, and a latch circuit for latching an output signal of the delay circuit and generating a column decoder activating signal every time a level of an internal clock signal changes. Thus, the column decoder activating signal is caused to attain the active level 1.5 clock cycles after the input of the active command so as to start a column-related operation so that the wasteful standby time can be shortened. Thus, a higher speed data read/write operation can be achieved.

8 Claims, 17 Drawing Sheets

FIG.6

| TCLK (ns) | tRCD (ns) | CL (ns) | tRCD+CL(ns) | |
|---|---|---|---|---|
| | | | PRESENT INVENTION | PRIOR ART |
| 7.5 | 7.5×2=15 | 7.5×2=15 | 30 | 30 |
| 8 | 8×2=16 | 8×2=16 | 32 | 32 |
| 10 | 10×1=10 | 10×2=20 | 30 | 40 |
| 12 | 12×1=12 | 12×2=24 | 36 | 48 |
| 15 | 15×1=15 | 15×2=30 | 45 | 60 |
| 20 | 20×1=20 | 20×2=40 | 60 | 80 |

SEMICONDUCTOR MEMORY DEVICE THAT OPERATES IN SYCHRONIZATION WITH A CLOCK SIGNAL

BACKGROUND OF THE INVENTION

1. Field of the Invention

The present invention relates to a semiconductor memory device, and more specifically, to a semiconductor memory device that operates in synchronization with a clock signal.

2. Description of the Background Art

FIG. 15 is a block diagram representing an arrangement of a portion related to read/write control of data of a conventional synchronous dynamic random access memory (hereinafter referred to as an SDRAM. In FIG. 15, the SDRAM includes input buffers 50 to 54, an output buffer 55, latch circuits 56 to 60, a command decoder 61, a row-related control signal generating circuit 62, a column-related control signal generating circuit 63, shift registers 64, 65, and an output-related control signal generating circuit 66.

Input buffer 50 generates an internal clock signal intCK according to an external clock signal CLK. Internal clock signal intCK is supplied to latch circuits 56 to 60, shift registers 64, 65, and column-related control signal generating circuit 63.

Input buffers 51 to 53 respectively transmit external control signals /RAS, /CAS, /WE to latch circuits 56 to 58. Latch circuits 56 to 58 respectively latch external control signals /RAS, /CAS, /WE, respectively generate internal control signals intR, intC, intW, and supply the generated signals to command decoder 61 in response to a rising edge of internal clock signal intCK.

Input buffer 54 and latch circuit 59 latch an external data signal DI and generate an internal data signal DI' in response to a rising edge of internal clock signal intCK. Internal data signal DI' is written into a memory cell selected via a data bus.

An internal data signal DO' read from a selected memory cell is supplied to latch circuit 60 via a data bus. Latch circuit 60 and output buffer 55 latch internal data signal DO' and generate an external data signal DO in response to a rising edge of internal clock signal intCK. When a signal OEM attains the logic high or the "H" level, data signal DO is output to the outside.

Command decoder 61 generates a row-related activating signal ACT and a column-related activating signals READ, WRITE according to a combination of logic levels of internal control signals intR, intC, intW. Row-related control signal generating circuit 62 generates a row address latch signal RAL, a word line trigger signal φWL, a bit line equalize signal BLEQ, a bit line interrupt signal BLI, a sense amplifier activating signal SE and the like according to signals ACT, READ, WRITE, and thus controls a row-related operation.

Shift register 64 takes in a level of signal ACT in response to each rising edge of internal clock signal intCK, and outputs the taken-in level of signal ACT in response to a succeeding rising edge of internal clock signal intCK. An output signal CDE of shift register 64 is supplied to column-related control signal generating circuit 63 and shift register 65.

Column-related control signal generating circuit 63 generates a column address latch signal CAL, a data input latch signal DIL, a column select line activating signal φCSL, an IO switching signal IOSW, an IO equalize signal IOEQ, a preamplifier activating signal PAE, a write driver activating signal WDE and the like according to signals CDE, READ, WRITE, intCK, and thus controls a column-related operation.

Shift register 65 takes in a level of signal CDE in response to each rising edge of internal clock signal intCK, and outputs the taken-in level of signal CDE in response to a succeeding rising edge of internal clock signal intCK. An output signal DBE of shift register 65 is supplied to output-related control signal generating circuit 66. Output-related control signal generating circuit 66 generates signal OEM according to signals DBE, READ. Signal OEM is supplied to output buffer 55.

FIG. 16 is a timing chart showing read control of an SDRAM in a case where a period TCLK of clock signal CLK is relatively short.

In FIG. 16, when an active command (/RAL=L, /CAS=H, /WE=H) is input in synchronization with a rising edge (time t0) of clock signal CLK (that is, intCK), internal control signals intR, intC, intW respectively attain the "H" level, the logic low or the "L" level, and the "L" level, and accordingly, signal ACT rises to the "H" level. When signal ACT rises to the "H" level, word line trigger signal φWL rises to the "H" level, and a selected word line WL rises to the "H" level. In addition, signal CDE rises to the "H" level in response to the second rising edge of clock signal CLK after signal ACT rises to the "H" level.

When a read command (/RAS=H, /CAS=L, /WE=H) is input in synchronization with the rising edge (time t2) of clock signal CLK that comes two clock cycles after the input of the active command, internal control signals intR, intC, intW, respectively attain the "L" level, the "H" level, and the "L" level, and accordingly, signal READ rises to the "H" level.

When signals CDE and READ both rise to the "H" level, column select line activating signal φCSL is raised to the "H" level, and a selected column select line CSL rises to the "H" level. In addition, signal DBE rises to the "H" level in response to the second rising edge (time t4) of clock signal CLK after signal CDE rises to the "H" level and read data signal DO is output to the outside.

In this manner, in a conventional SDRAM, a row-related read operation is performed in response to the input of an active command, and a read command is input after a prescribed clock cycle duration tRCD (the duration of two clock cycles in the chart) since the input of the active command. When the read command is input, a column-related read operation is performed, and read data signal DO is output to the outside after a prescribed clock cycle duration CL (a duration of two clock cycles in the chart) since the input of the read command.

The row-related read operation, however, terminates after a certain period of time since the input of the active command according to the performance of the SDRAM, and this time period does not necessarily equal an integer multiple of the period of clock signal CLK. Thus, as shown in FIG. 17, when a clock signal CLK having a relatively long period is used as in the system that requires numerous SDRAM to operate with stability, an RAS-CAS delay time tRCD becomes significantly longer than the time required for the row-related read operation so that there was a problem of a long wasteful standby time. The same was true of the data write operation.

SUMMARY OF THE INVENTION

Thus, the main object of the present invention is to provide a semiconductor memory device capable of read/write operation at a higher speed.

A semiconductor memory device according to the present invention is provided with an input circuit for taking in a plurality of external control signals in response to a clock signal changing from a first level to a second level, a decoder for selectively causing a first internal control signal or a second internal control signal to attain an active level according to the plurality of external control signals taken into the input circuit, a signal generating circuit for causing a third internal control signal to attain an active level in response to a predetermined time period having elapsed since the first internal control signal attained the active level and in response to the level of the clock signal changing, and a read/write circuit for performing part of data read/write operation in response to the first internal control signal attaining the active level and for performing the rest of data read/write operation in response to the second and third internal control signals both attaining the active level. Thus, even when the period of the clock signal is long, part of the data read/write operation is first started, and then after 1.5 clock cycles, the rest of the data read/write operation can be started so that the wasteful standby period can be shortened, and a higher speed read/write operation can be achieved.

Preferably, the signal generating circuit includes a delay circuit for delaying the first internal control signal for a predetermined time period, a pulse generating circuit for outputting a pulse signal every time the level of the clock signal changes, and a latch circuit for latching an output signal from the delay circuit in response to each pulse signal, and an output signal from the latch circuit becomes the third internal control signal. In this case, the signal generating circuit can be configured with ease.

In addition, another semiconductor memory device according to the present invention is provided with an input circuit for taking in a plurality of external control signals in response to a clock signal changing from a first level to a second level, a decoder for selectively causing a first internal control signal or a second internal control signal to attain an active level according to the plurality of external control signals taken into the input circuit, a signal generating circuit for causing a third internal control signal to attain an active level in response to the clock signal changing from the second level to the first level after the second internal control signal attains the active level, and a read/write circuit for performing part of data read/write operation in response to the first internal control signal attaining the active level, and for performing the rest of the data read/write operation in response to the second and third internal control signals both attaining the active level. Thus, even when the period of the clock signal is long, part of the data read/write operation is first started, and then after 1.5 clock cycles, the rest of the data read/write operation can be started so that the wasteful standby time can be shortened, and a higher speed read/write operation can be achieved.

Preferably, the signal generating circuit includes an inverter for receiving a clock signal and outputting an inverted clock signal, and a latch circuit for latching the second internal control signal in response to the inverted clock signal changing from a first level to a second level, and an output signal from the latch circuit becomes the third internal control signal. In this case, the signal generating circuit can be configured with ease.

In addition, a further semiconductor memory device according to the present invention is provided with an input circuit for taking in a plurality of external control signals in response to a clock signal changing from a first level to a second level, a decoder for selectively causing a first internal control signal or a second internal control signal to attain an active level according to the plurality of external control signals taken into the input circuit, a signal generating circuit for causing a third internal control signal to attain an active level in response to the clock signal having changed from the second level to the first level a predetermined number of times after the first internal control signal attained the active level, and a read/write circuit for performing part of data read/write operation in response to the first internal control signal attaining the active level, and for performing the rest of the data read/write operation in response to the second and third internal control signals both attaining the active level. Thus, even when the period of the clock signal is long, part of the data read/write operation is first started, and then after 1.5 clock cycles, the rest of the data read/write operation can be started so that the wasteful standby time can be shortened and a higher speed read/write operation can be achieved.

Preferably, the signal generating circuit includes an inverter for receiving a clock signal and outputting an inverted clock signal, and a shift register for taking in a level of the first internal control signal and outputting the level of the first internal control signal previously taken in, every time the inverted clock signal changes from the first level to the second level, and an output signal from the shift register becomes the third internal control signal. In this case, the signal generating circuit can be configured with ease.

More preferably, the above further semiconductor memory device according to the present invention is further provided with a setting circuit for selectively setting a fourth internal control signal to an active level or to an inactive level from outside, and the signal generating circuit causes the third internal control signal to attain the active level in response to the clock signal having changed from the second level to the first level a predetermined number of times when the fourth internal control signal is at the active level, and causes the third internal control signal to attain the active level in response to the clock signal having changed from the first level to the second level a predetermined number of times when the fourth internal control signal is at the inactive level. In this case, it can be selected at will whether to perform the rest of the read/write operation in response to a rising edge of the clock signal or in response to a falling edge of the clock signal.

More preferably, the signal generating circuit includes an inverter for receiving a clock signal and outputting an inverted clock signal, a gate circuit for receiving the clock signal and the inverted clock signal and for allowing the inverted clock signal to pass through when the fourth internal control signal is at the active level, while allowing the clock signal to pass through when the fourth internal control signal is at the inactive level, and a shift register for taking in a level of the first internal control signal and outputting the level of the first internal control signal previously taken in, every time the inverted clock signal or the clock signal that passes through the gate circuit changes from the first level to the second level, and an output signal from the shift register becomes the third internal control signal. In this case, the signal generating circuit can be configured with ease.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a diagram related to the description of an effect of the SDRAM shown in FIGS. 1 to 5.

DESCRIPTION OF THE PREFERRED EMBODIMENTS

First Embodiment

Figure 1:
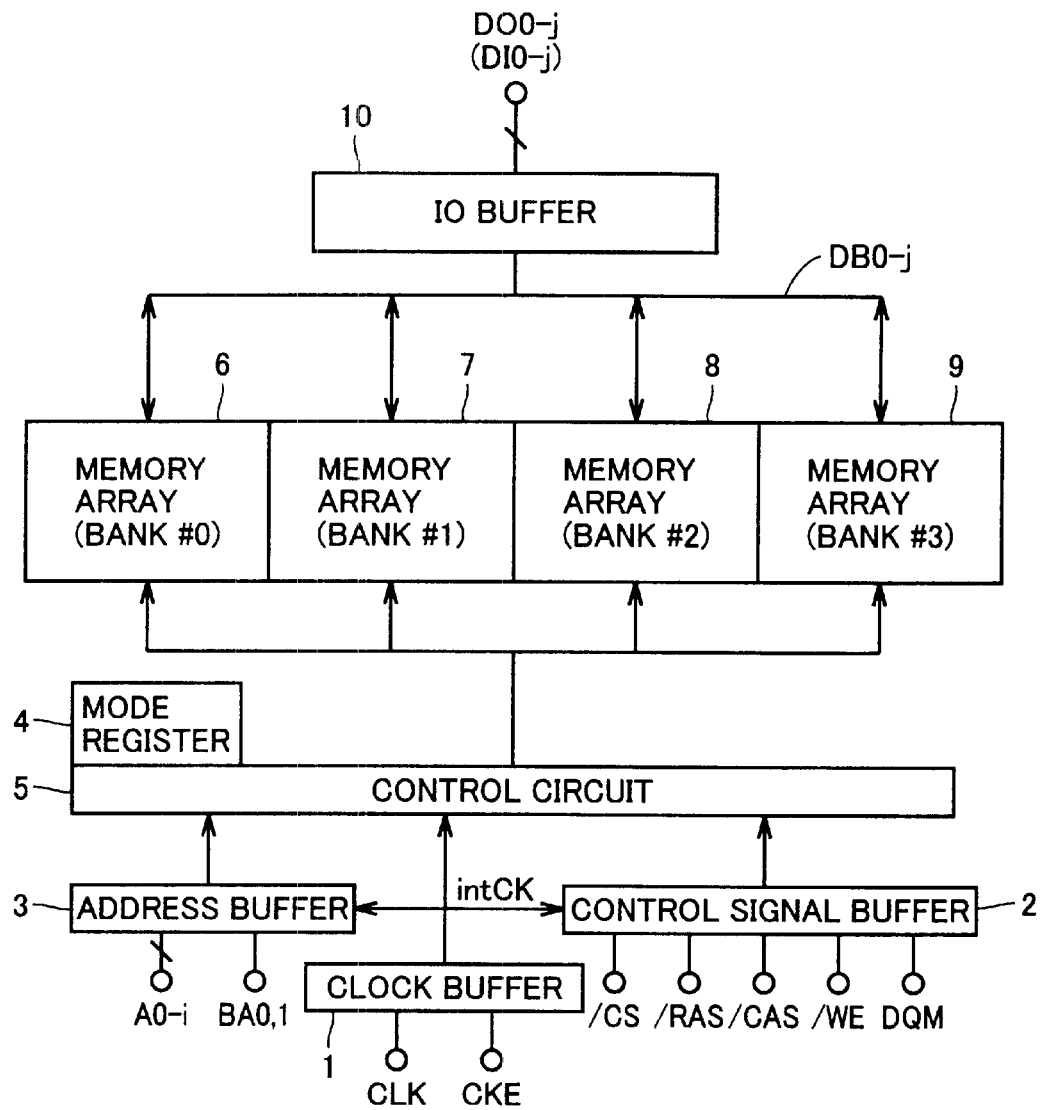
FIG. 1 is a block diagram representing an overall arrangement of an SDRAM according to a first embodiment of the present invention.

FIG. 1 is a block diagram representing the overall arrangement of the SDRAM according to the first embodiment of the present invention. In FIG. 1, the SDRAM is provided with a clock buffer 1, a control signal buffer 2, an address buffer 3, a mode register 4, a control circuit 5, four memory arrays 6 to 9 (banks #0 to #3), and an IO buffer .10.

Clock buffer 1 is activated by an external control signal CKE, generates an internal clock signal intCK according to an external clock signal CLK, and supplies internal clock signal intCK to control signal buffer 2, address buffer 3, and control circuit 5. Control signal buffer 2 latches external control signals /CS, /RAS, /CAS, /WE, DQM, generates internal control signals intR, intC, intW, and so on and supplies the generated internal control signals to control circuit 5 in synchronization with internal clock signal intCK from clock buffer 1. Address buffer 3 latches external address signals A0 to Ai (i is an integer greater than or equal to 0) and bank selecting signals BA0, BA1 and supplies the latched signals to control circuit 5 in synchronization with internal clock signal intCK from clock buffer 1.

Mode register 4 stores a mode instructed by external address signals A0 to Ai and the like, and outputs an internal command signal corresponding to that mode. Each of memory arrays 6 to 9 includes a plurality of memory cells which are arranged in a matrix of rows and columns and each of which stores one bit of data. The plurality of memory cells are divided in advance into groups of j+1 memory cells (j is an integer greater than or equal to 0).

Control circuit 5 generates various internal signals according to signals from clock buffer 1, control signal buffer 2, address buffer 3, and mode register 4, and controls the entire SDRAM. During a write operation and during a read operation, control circuit 5 selects one of four memory arrays 6 to 9 according to bank selecting signals BA0, BA1, and selects j+1 memory cells from the selected memory array according to address signals A0 to Ai. The selected j+1 memory cells are activated and coupled to IO buffer 10.

IO buffer 10 supplies externally input data DI0 to DIj to the selected j+1 memory cells during a write operation, and outputs read data DO0 to DOj of j+1 memory cells to the outside during a read operation.

Figure 2:
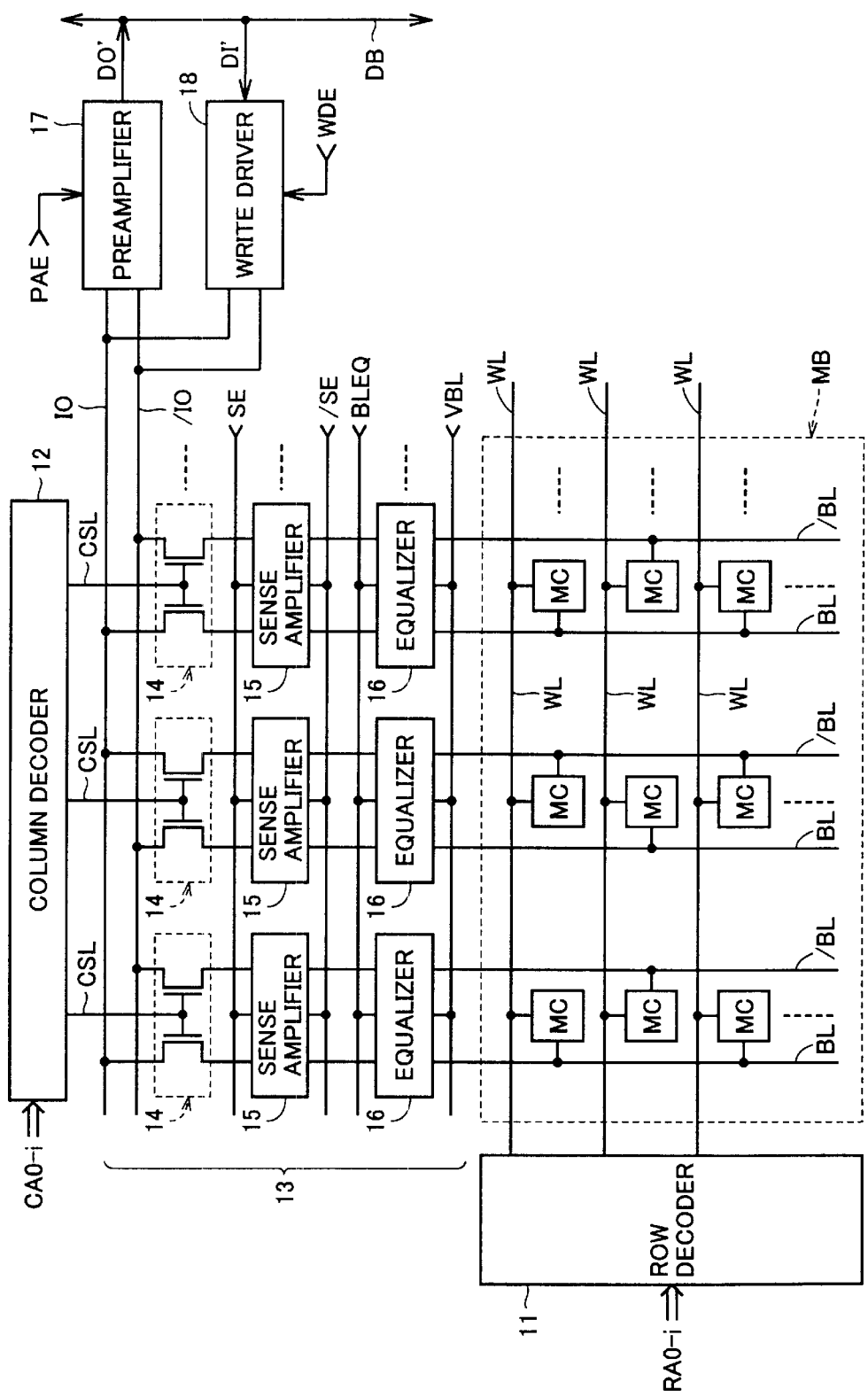
FIG. 2 is a circuit block diagram representing an arrangement of a portion of a memory array shown in FIG. 1 and of a portion related to the portion of the memory array.

FIG. 2 is a circuit block diagram representing an arrangement of a portion of memory array 6 shown in FIG. 1 and a portion related to this portion of memory array 6. In FIG. 2, memory array 6 includes a plurality of memory blocks MB, and each memory block MB includes a plurality of memory cells MC arranged in a matrix of rows and columns, a word line WL provided for each row, and a bit line pair BL, /BL provided corresponding to each column. A memory cell MC is of a well-known type that includes an accessing transistor and a capacitor for storing information.

Corresponding to a memory block MB, a row decoder 11, a column decoder 12, a sense amplifier +input/output control circuit 13, a preamplifier 17, and a write driver 18 are provided. Sense amplifier+input/output control circuit 13 includes data input/output line pair IO, /IO as well as a column select line CSL, a column select gate 14, a sense amplifier 15, and an equalizer 16 provided corresponding to each column of memory block MB.

Column select gate 14 includes a pair of N-channel MOS transistors connected between a bit line pair BL, /BL of a corresponding column and data input/output line pair IO, /IO. A gate of each N-channel MOS transistor is connected to column decoder 12 via column select line CSL of a corresponding column. When column decoder 12 causes column select line CSL to rise to the select level or the "H" level, N-channel MOS transistors are rendered conductive, and bit line pair BL, /BL are coupled to data input/output line pair IO, /IO.

Sense amplifier 15 amplifies a small potential difference between bit lines BL, /BL to a power-supply voltage VCC in response to sense amplifier activating signals SE, /SE respectively attaining the "H" level and the "L" level. Equalizer 16 equalizes the potentials of bit lines BL, /BL to a bit line potential VBL in response to a bit line equalize signal BLEQ attaining the active level or the "H" level.

Row decoder 11 causes one of a plurality of word lines WL to rise to the select level or the "H" level according to row address signals RA0 to RAi (address signals A0 to Ai at the time when external control signal /RAS is at the "L" level). Column decoder 12 causes one of a plurality of column select lines CSL to rise to the select level or the "H" level according to column address signals CA0 to CAi (address signals A0 to Ai at the time when external control signal /CAS is at the "L" level).

Preamplifier 17 is rendered active in response to a signal PAE attaining the active level or the "H" level, compares the potentials of data input/output lines IO and /IO, and supplies an internal data signal DO' of a level corresponding to the result of comparison to IO buffer 10 via a data bus DB. Write driver 18 is rendered active in response to a signal WDE attaining the active level or the "H" level, and causes one of data input/output lines IO, /IO to attain the "H" level and the other data input/output line to attain the "L" level according to an internal data signal DI' supplied from IO buffer 10 via data bus DB.

Next, an operation of a portion of memory array 6 shown in FIG. 2 and a portion related to this portion of memory array 6 will be described. During a read mode, first, bit line equalize signal BLEQ falls to the "L" level, and an equalizing operation of bit line pair BL, /BL is interrupted. Then, row decoder 11 causes a word line WL of a row corresponding to row address signals RA0 to RAi to rise to the select level or the "H" level, and an N-channel MOS transistor of a memory cell MC of that row is rendered conductive. Consequently, the potentials of bit lines BL, /BL change by a small amount according to the amount of charge in a capacitor of an activated memory cell MC.

Then, sense amplifier activating signals SE, /SE respectively attain the "H" level and the "L" level, thereby activating sense amplifier 15. When the potential of bit line BL is slightly higher than the potential of bit line /BL, the potential of bit line BL is pulled up to the "H" level, while the potential of bit line /BL is pulled down to the "L" level. Conversely, when the potential of bit line /BL is slightly higher than the potential of bit line BL, the potential of bit line /BL is pulled up to the "H" level, while the potential of bit line BL is pulled down to the "L" level.

Then, column decoder 12 causes a column select line CSL of a column corresponding to column address signals CA0 to CAi to rise to the select level or the "H" level, and a column select gate 14 of that column is rendered conductive. Data of bit line pair BL, /BL of the selected column is supplied to preamplifier 17 via column select gate 12 and data input/output line pair IO, /IO. Preamplifier 17 outputs internal data signal DO' to data bus DB in response to signal PAE.

During a write mode, like the read mode, one word line WL and one column select line CSL attain the select level or the "H" level, and one activated memory cell MC is connected to write driver 18 via bit line pair BL, /BL, column select gate 14, and data input/output line pair IO, /IO. Write driver 18 writes internal data signal DI' from data bus DB into a selected memory cell MC in response to signal WDE. Other memory arrays 7 to 9 have the same arrangement as that of memory array 6.

Figure 3:
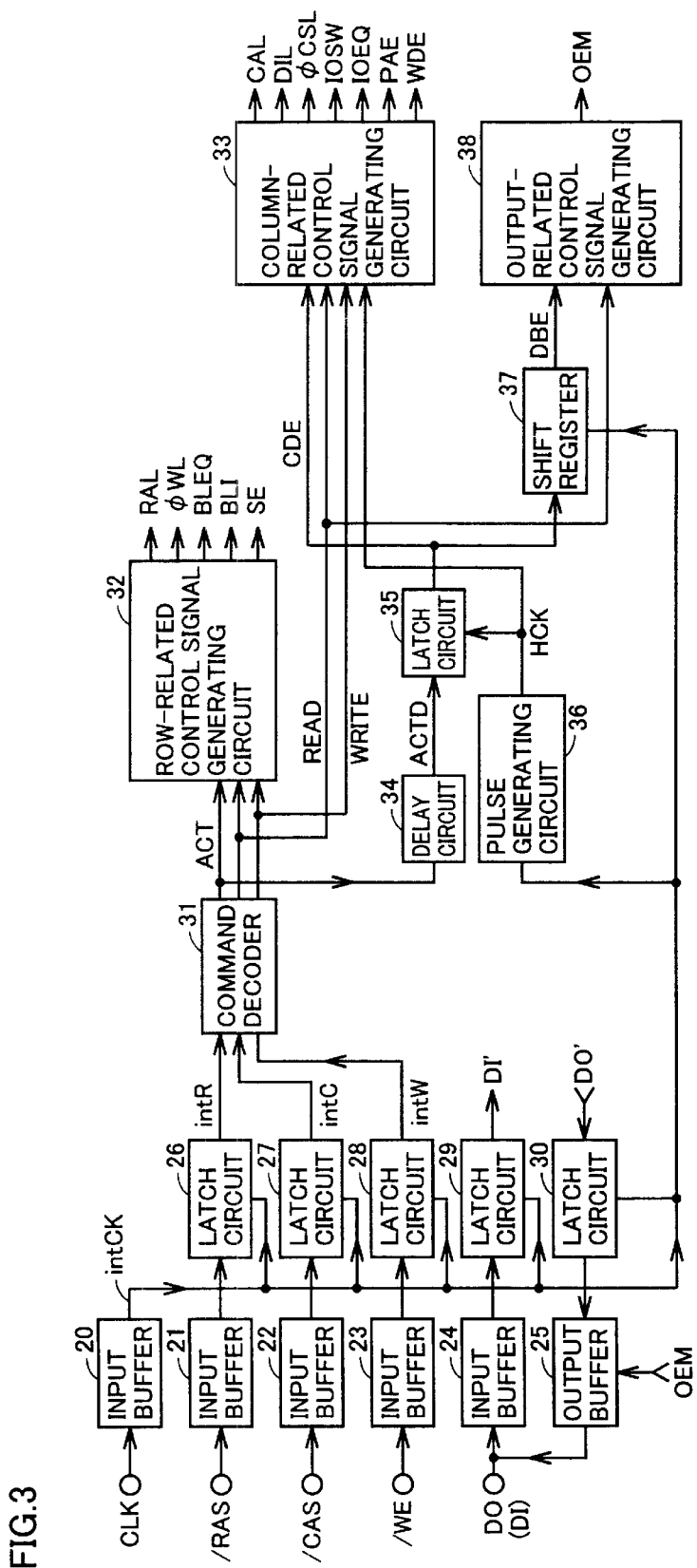
FIG. 3 is a block diagram representing in detail an arrangement of a portion related to read/write control of the SDRAM shown in FIG. 1.

FIG. 3 is a block diagram representing an arrangement of a portion related to the data read/write control of the SDRAM. In FIG. 3, the SDRAM is provided with an input buffer 20 included in a clock buffer 1; input buffers 21 to 23 and latch circuits 26 to 28 included in a control signal buffer 2; an input buffer 24, an output buffer 25, and latch circuits 29, 30 included in an IO buffer 10; and a command decoder 31, a row-related control signal generating circuit 32, a column-related control signal generating circuit 33, a delay circuit 34, a latch circuit 35, a pulse generating circuit 36, a shift register 37, and an output-related control signal generating circuit 38 included in a control circuit 5.

Input buffer 20 generates an internal clock signal intCK according to an external clock signal CLK, and supplies internal clock signal intCK to latch circuits 26 to 30, pulse generating circuit 36, and shift register 37.

Input buffers 21 to 23 respectively supply external control signals /RAS, /CAS, /WE to latch circuits 26 to 28. Latch circuits 26 to 28 respectively latch external control signals /RAS, /CAS, /WE, generate internal control signals intR, intC, intW, and supply the generated internal control signals to command decoder 31 in response to a rising edge of internal clock signal intCK.

Input buffer 24 supplies an external data signal DI to latch circuit 29. Latch circuit 29 latches external data signal DI, generates an internal data signal DI', and supplies the generated internal data signal to data bus DB in response to a rising edge of internal clock signal intCK. Latch circuit 30 latches an internal data signal DO' from data bus DB and supplies the latched internal data signal to output buffer 25 in response to a rising edge of internal clock signal intCK. Output buffer 25 outputs a data signal DO from latch circuit 30 to the outside in response to a signal OEM attaining the active level or the "H" level.

Command decoder 31 generates a row-related activating signal ACT and column-related activating signals READ, WRITE according to a combination of logic levels of internal control signals intR, intC, intW. Row-related control signal generating circuit 32 generates a row address latch signal RAL, a word line trigger signal φWL, a bit line equalizing BLEQ, a bit line interrupt signal BLI, a sense amplifier activating signal SE and the like according to signals ACT, READ, WRITE, and thus controls a row-related operation.

Delay circuit 34 generates a signal ACTD by delaying signal ACT by a predetermined delay time Td (for instance, 12 ns), and supplies signal ACTD to latch circuit 35. Delay time Td is set to a necessary and sufficient time period from the time when signal ACT attains the active level or the "H" level to the time when an operation of a row-related circuit is completed.

Pulse generating circuit 36 causes a signal HCK to attain the "H" level in a pulse-like manner in response to a rising edge and a falling edge of internal clock signal intCK. Signal HCK becomes a clock signal having a frequency that is two times the frequency of internal clock signal intCK. Latch circuit 35 latches a level of signal ACTD from delay circuit 34, generates a column decoder activating signal CDE, and supplies the generated signal to column-related control signal generating circuit 33 and shift register 37 in response to a rising edge of signal HCK.

Column-related control signal generating circuit 33 generates a column address latch signal CAL, a data input latch signal DIL, a column select line activating signal φCSL, an IO switching signal IOSW, an IO equalize signal IOEQ, a preamplifier activating signal PAE, a write driver activating signal WDE and the like according to signals CDE, READ, WRITE, and HCK, and thus controls a column-related operation.

Shift register 37 takes in a level of signal CDE in response to each rising edge of internal clock signal intCK, and outputs the level of signal CDE previously taken in, in response to a succeeding rising edge. An output signal from shift register 37 becomes a data bus activating signal DBE.

Output-related control signal generating circuit 38 generates signal OEM according to signals DBE, READ, and supplies signal OEM to output buffer 25.

Figure 4:
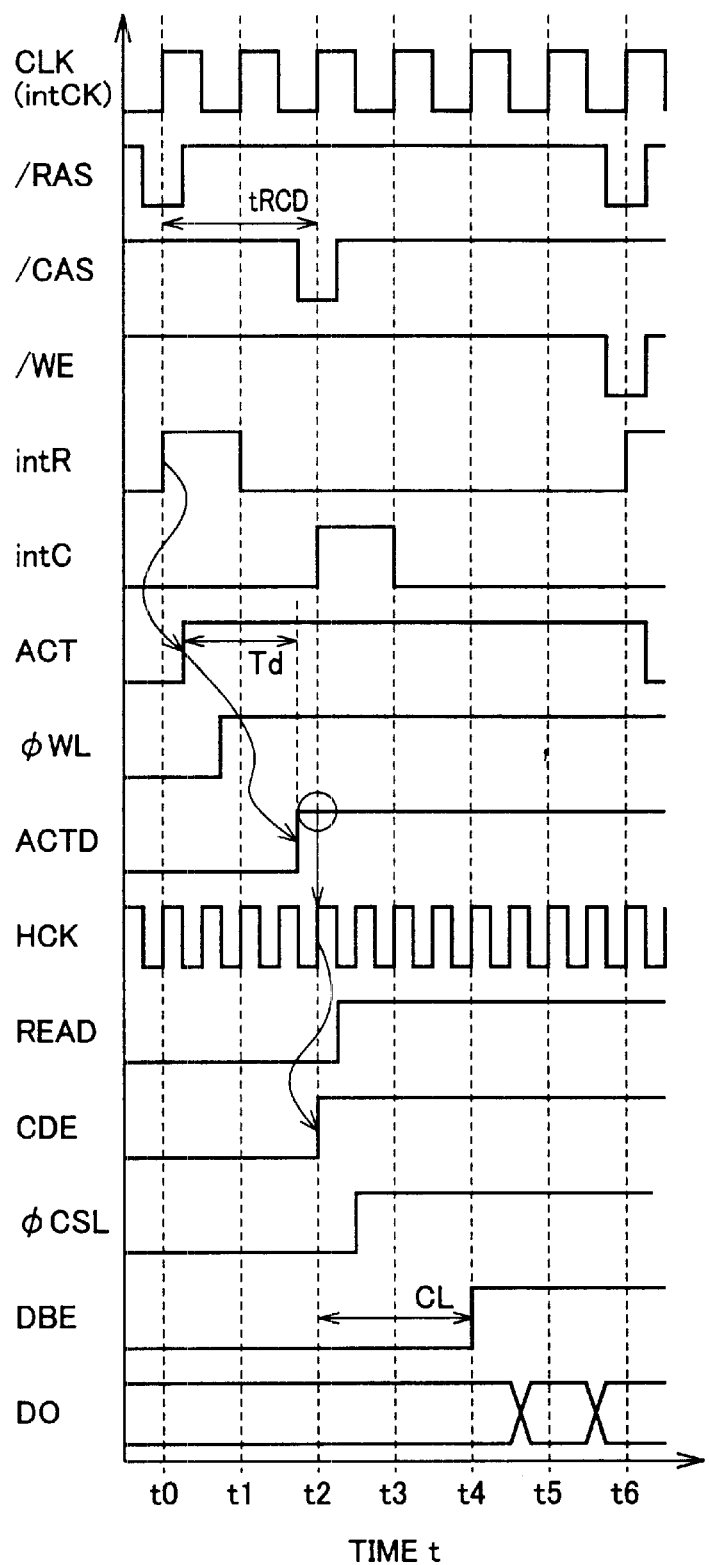
FIG. 4 is a timing chart showing a read operation in a case where a period of a clock signal of the SDRAM shown in FIGS. 1 to 3 is relatively short.

FIG. 4 is a timing chart showing read control of the SDRAM when a period TCLK of a clock signal CLK is relatively short (for instance, TCLK=8 ns). In FIG. 4, when an active command (/RAS=L, /CAS=H, /WE=H) is input in synchronization with a rising edge (time t0) of clock signal CLK, internal control signals intR, intC, intW respectively attain the "H" level, the "L" level, and the "L" level, and accordingly, signal ACT rises to the "H" level.

When signal ACT rises to the "H" level, the equalizing operation of bit line pair BL, /BL is interrupted, a word line WL designated by row address signals RA0 to RAi rises to the "H" level, and sense amplifier 15 is activated.

When a delay time Td (12 ns) of delay circuit 34 has passed since signal ACT rose to the "H" level, signal ACTD rises to the "H" level, and the level of signal ACTD is latched and signal CDE rises to the "H" level in response to the rising edge of signal HCK that immediately follows (the fourth edge of clock signal CLK after signal ACT rises to the "H" level; at time t2).

In addition, when a read command (/RAS=H, /CAS=L, /WE=H) is input in synchronization with the rising edge (time t2) of clock signal CLK that comes two clock cycles after the input of the active command, internal control signals intR, intC, intW respectively attain the "L" level, the "H" level, and the "L" level, and accordingly, signal READ rises to the "H" level.

When signals CDE and READ both attain the "H" level, a prescribed number (for instance, two) of column select lines CSL designated by column address signals CA0 to CAi each rise to the "H" level for every clock cycle sequentially. Column address signals of the second column select line CSL and beyond are generated inside the SDRAM based on column address signals CA0 to CAi of the first column select line CSL. Moreover, in response to the second rising edge (time t4) of clock signal CLK after signal CDE rises to the "H" level, signal DBE rises to the "H" level, and accordingly, a prescribed number of read data signals DO are successively output in synchronization with clock signal CLK.

When a precharge command (/RAS=L, /CAS=H, /WE=L) is input in synchronization with the sixth rising edge of clock signal CLK after the input of the active command, internal control signals intR, intC, intW respectively attain the "H" level, the "L" level, and the "H" level, and accordingly, signal ACT falls to the "L" level.

When signal ACT falls to the "L" level, word line WL falls to the "L" level, thereby rendering sense amplifier 15 inactive. Thus, the equalizing operation of bit line pair BL, /BL is started, and column select line CSL attains the "L" level, and the read operation ends.

Figure 5:
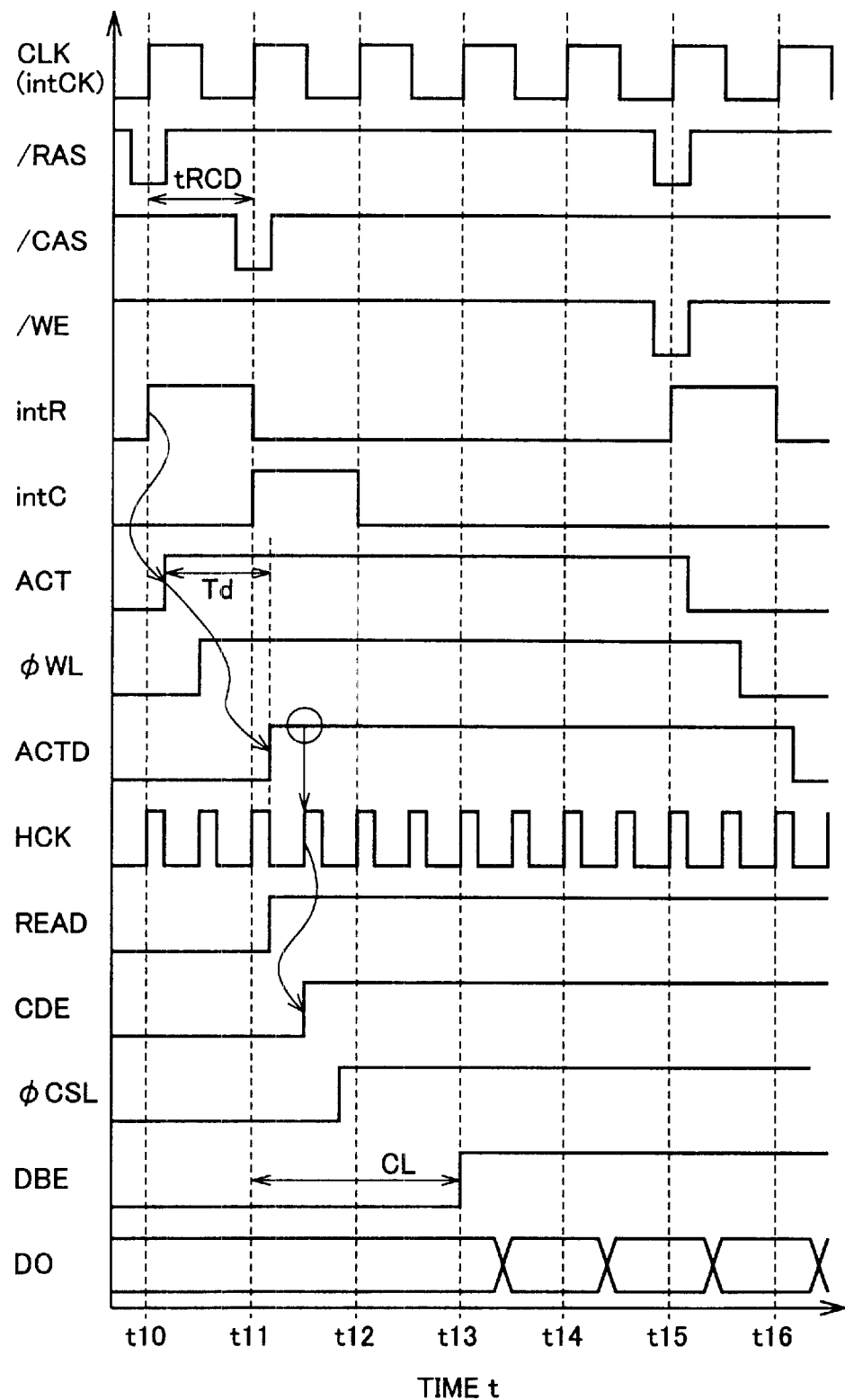
FIG. 5 is a timing chart showing a read operation in a case where the period of the clock signal of the SDRAM shown in FIGS. 1 to 3 are relatively long.

FIG. 5 is a timing chart showing a read operation of the SDRAM in a case where period TCLK of clock signal CLK is relatively long (for instance, TCLK=12 ns). In FIG. 5, an active command is input in synchronization with a rising edge (time t10) of clock signal CLK, and signal ACT rises to the "H" level. When signal ACT rises to the "H" level, the equalizing operation of bit line pair BL, /BL is interrupted, and word line WL rises to the "H" level, thereby activating sense amplifier 15.

When a delay time Td of delay circuit 34 has passed since signal ACT rose to the "H" level, signal ACTD rises to the "H" level, and the level of signal ACTD is latched and signal CDE rises to the "H" level in response to the rising edge of signal HCK that immediately follows (the third edge of clock signal CLK after signal ACT rises to the "H" level).

In addition, a read command is input in synchronization with the rising edge (time t11) of clock signal CLK that comes one clock cycle after the input of the active command, and signal READ rises to the "H" level. When signals CDE and READ both attain the "H" level, a prescribed number of column select lines CSL designated by column address signals CA0 to CAi each rise to the "H" level for one clock cycle sequentially. Moreover, in response to the second rising edge (time t13) of clock signal CLK after signal CDE rises to the "H" level, signal DBE rises to the "H" level, and accordingly, a prescribed number of read data signals DO are successively output in synchronization with clock signal CLK.

FIG. 6 is a diagram illustrating the effect of the present invention. In FIG. 6, according to this SDRAM, when period TCLK of clock signal CLK is relatively short (TCLK=7.5 to 8 ns), RAS-CAS delay time tRCD becomes the duration of two clock cycles so that four clock cycles would be required from the input of an active command to the start of data output, and a sum tRCD+CL of RAS-CAS delay time tRCD and a CAS latency delay time CL becomes equal to that in the conventional example.

When period TCLK of clock signal CLK is relatively long (TCLK=10 to 20 ns), however, RAS-CAS delay time tRCD can be made to be the duration of one clock cycle so that the number of clock cycles required from the input of the active command to the start of the data output would only be three, and thus, tRCD+CL becomes one clock cycle shorter than in the conventional example. Thus, even when period of TCLK of external clock signal CLK is relatively long, the wasteful standby time from the input of the active command to the input of the read command can be shortened so that a higher data read speed can be achieved.

Second Embodiment

Figure 7:
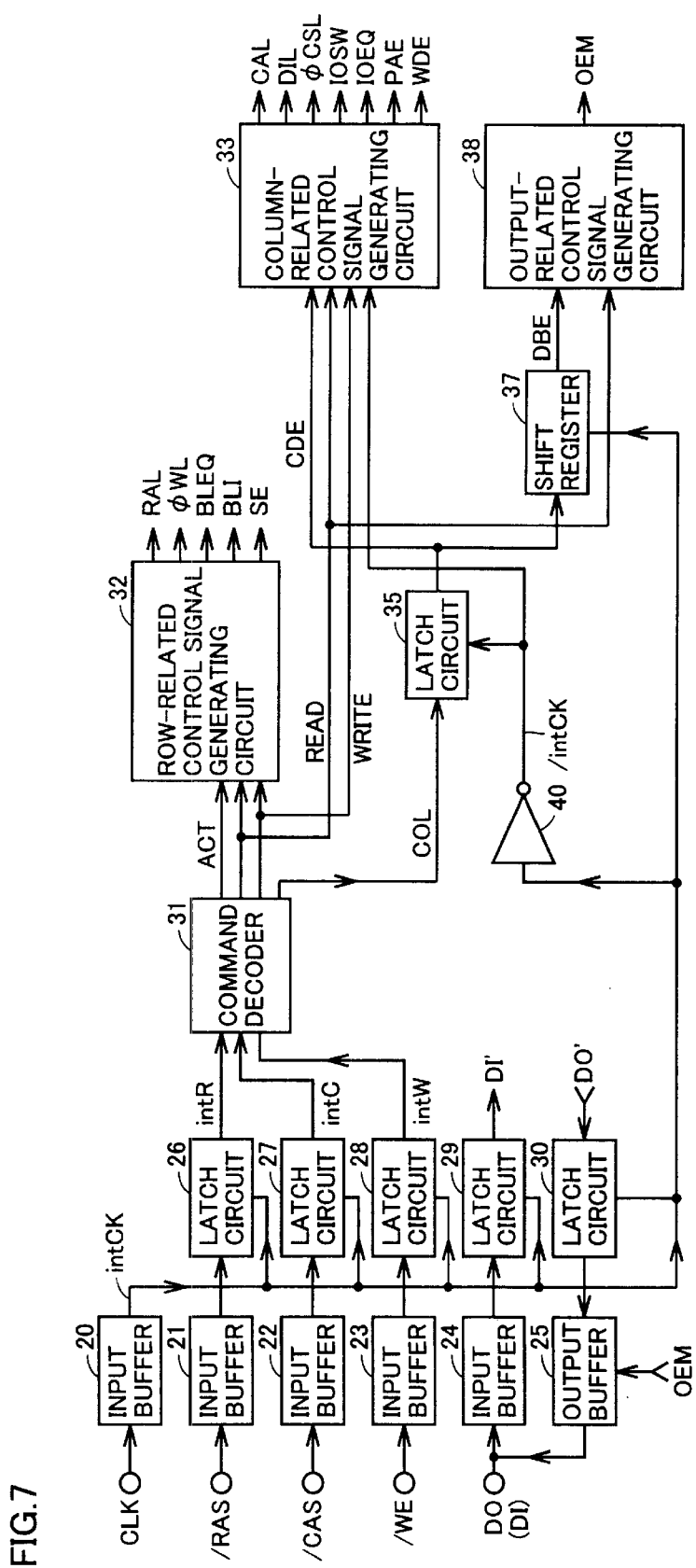
FIG. 7 is a circuit block diagram representing an arrangement of a portion related to read/write control of an SDRAM according to a second embodiment of the present invention.

FIG. 7 is a circuit block diagram representing a portion related to data read/write control of an SDRAM according to the second embodiment of the present invention, and is used in comparison with FIG. 3. In FIG. 7, the SDRAM according to the second embodiment differs from the SDRAM of the first embodiment in that delay circuit 34 is omitted, that pulse generating circuit 36 is replaced by an inverter 40, and that command decoder 31 outputs a signal COL. Signal COL is a signal that rises to the "H" level along with signals READ, WRITE. Inverter 40 receives an internal clock signal intCK and generates an inverted clock signal intCK. Inverted clock signal /intCK is supplied to latch circuit 35 and column-related control signal generating circuit 33 instead of signal HCK. Latch circuit 35 latches a level of signal COL and generates signal CDE in synchronization with a rising edge of clock signal /intCK.

Figure 8:
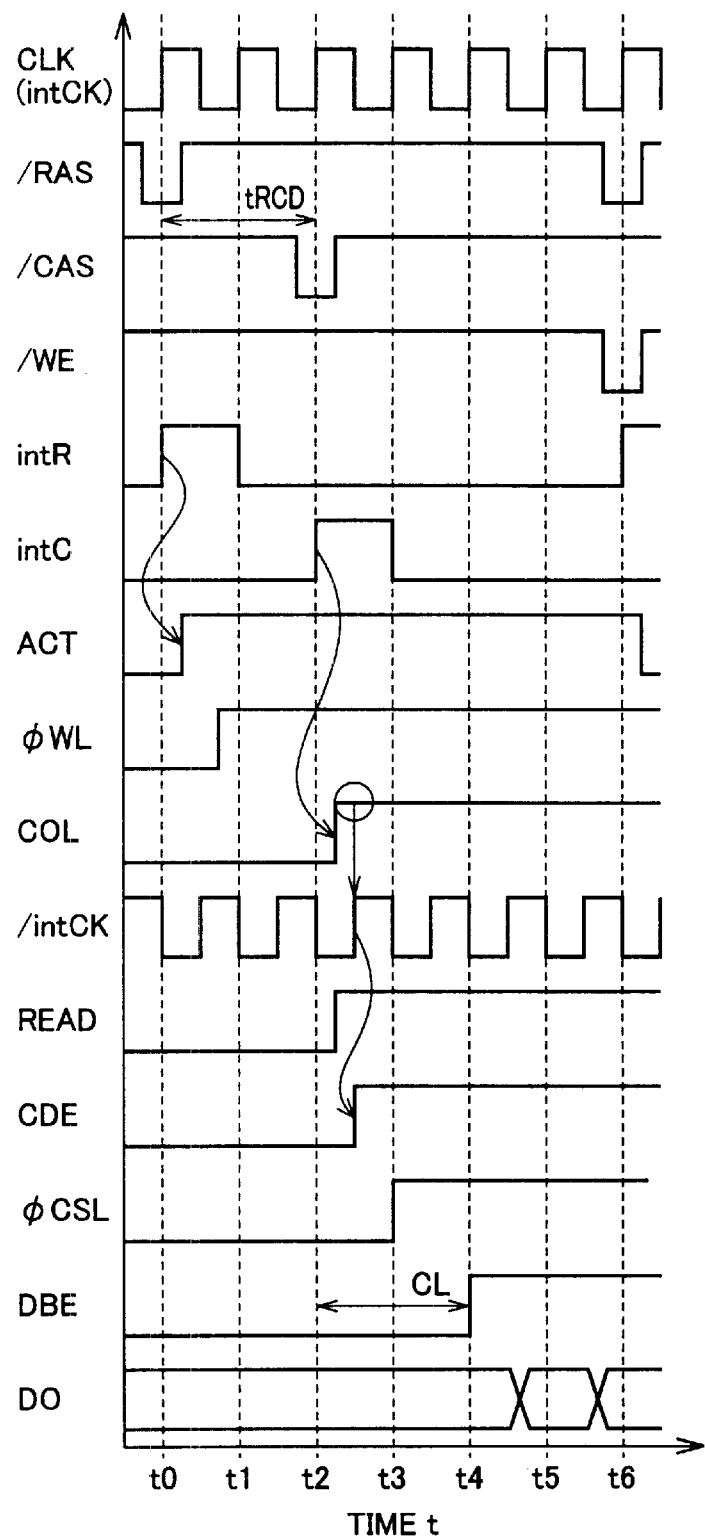
FIG. 8 is a timing chart showing a read operation in a case where a period of a clock signal of the SDRAM shown in FIG. 7 is relatively short.

FIG. 8 is a timing chart showing read control of the SDRAM when period TCLK of clock signal CLK is relatively short (for instance, TCLK=8 ns). In FIG. 8, a read command is input in synchronization with the rising edge (time t2) of clock signal CLK that comes two clock cycles after the input of the active command (time t0), and signals COL and READ rise to the "H" level. A level of signal COL is latched and signal CDE rises to the "H" level in response to a rising edge of clock signal /intCK that immediately follows a rising edge of signal COL (the third rising edge from the input of the active command).

In response to the second rising edge (time t4) of clock signal CLK after signal CDE rises to the "H" level, signal DBE rises to the "H" level, and accordingly, a prescribed number of read data signals DO are output successively in synchronization with clock signal CLK.

Figure 9:
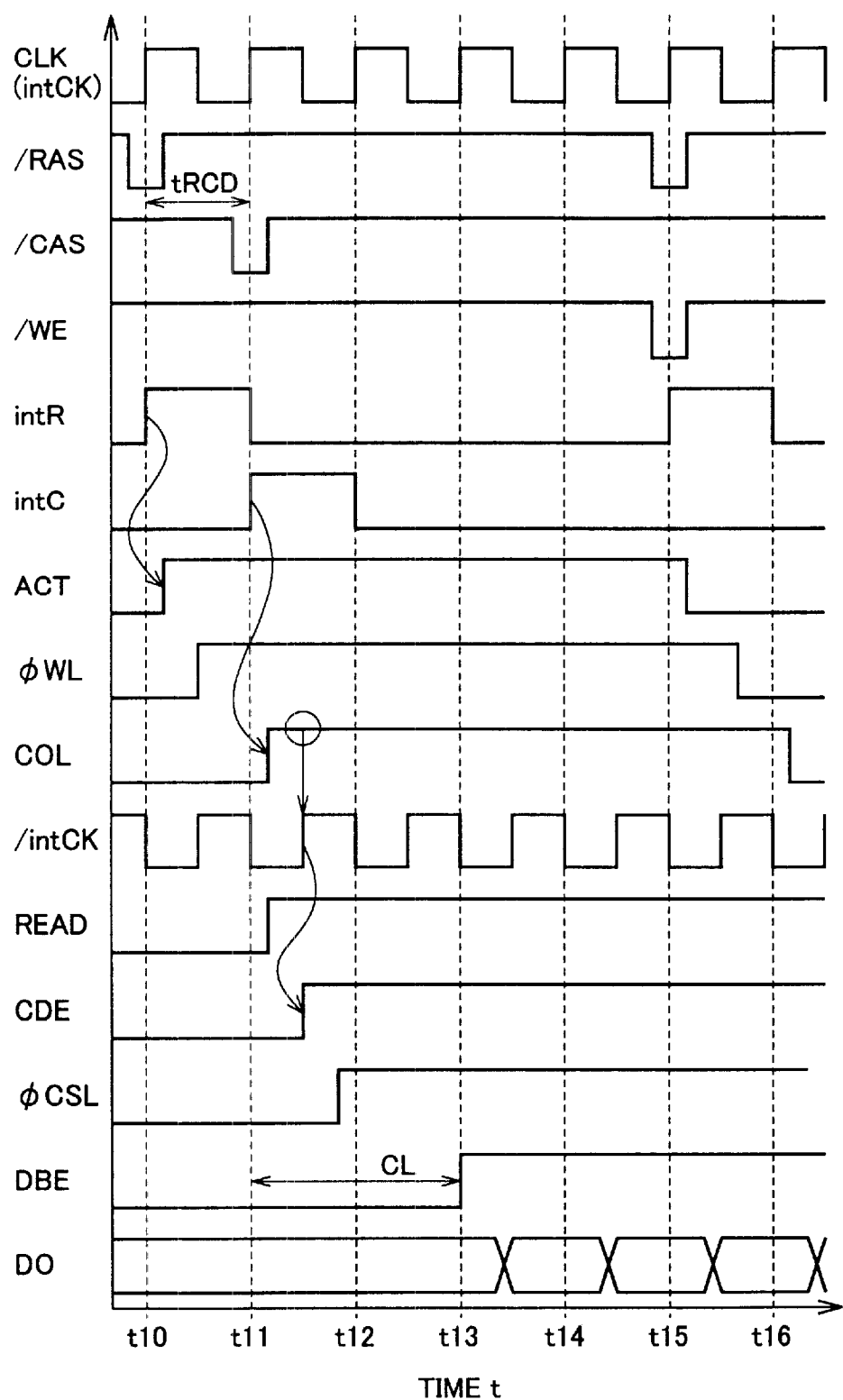
FIG. 9 is a timing chart showing a read operation when the period of the clock signal of the SDRAM shown in FIG. 7 is relatively long.

FIG. 9 is a timing chart showing read control of the SDRAM when period TCLK of clock signal CLK is relatively long (for instance, TCLK=12 ns). In FIG. 9, a read command is input in synchronization with the rising edge (time t11) of clock signal CLK that comes one clock cycle after the input of the active command (t10), and signals COL and READ rise to the "H" level. The level of signal COL is latched and signal CDE rises to the "H" level in response to a rising edge of clock signal /intCK that immediately follows a rising edge of signal COL (the second rising edge from the input of the active command).

In response to the second rising edge (time t13) of clock signal CLK after signal CDE rises to the "H" level, signal DBE rises to the "H" level, and accordingly, a prescribed number of read data signals DO are successively output in synchronization with clock signal CLK.

The same effects as those obtained by the first embodiment can be achieved by the second embodiment.

Third Embodiment

Figure 10:
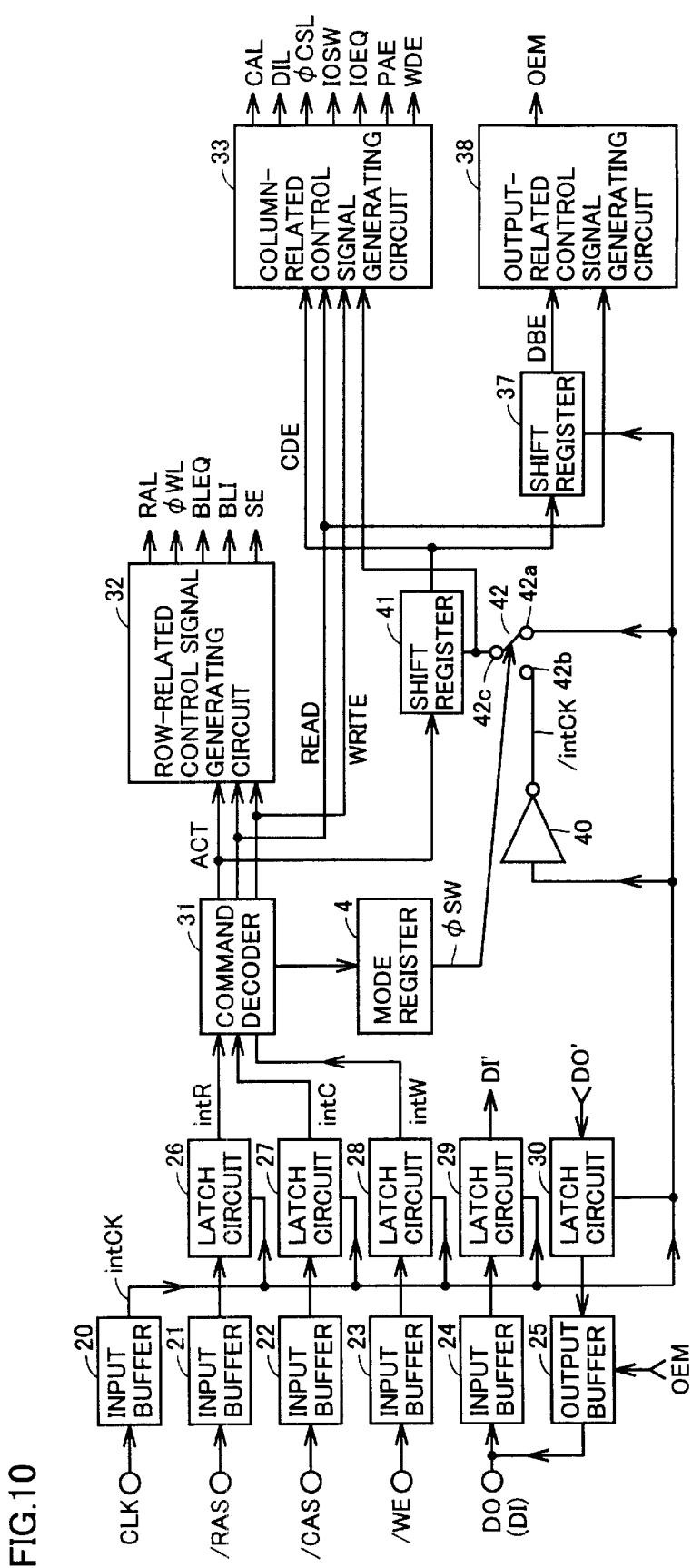
FIG. 10 is a circuit block diagram representing an arrangement of a portion related to read/write control of an SDRAM according to a third embodiment of the present invention.

FIG. 10 is a circuit block diagram representing a portion related to data read/write control of an SDRAM according to the third embodiment of the present invention, and is used in comparison with FIG. 7. In FIG. 10, this SDRAM differs from the SDRAM of FIG. 7 in that latch circuit 35 is replaced by a shift register 41 and a switch 42, and that mode register 4 outputs a switching signal φSW. Signal φSW is selectively set in advance to the "H" level or the "L" level by external control signals /RAS, /CAS, /WE, external address signals A0 to Ai and the like in advance. One switching terminal 42a of switch 42 receives an internal clock signal intCK, the other switching terminal 42b receives an output clock signal /intCK of inverter 40, and a common terminal 42c is connected to a clock terminal of shift register 41.

When signal φSW is at the "H" level, conduction is established between terminal 42a and terminal 42c of switch 42, and internal clock signal intCK is input to the clock terminal of shift register 41. When signal φSW is at the "L" level, conduction is established between terminal 42b and terminal 42c of switch 42, and inverted clock signal /intCK is input to the clock terminal of shift register 41.

Shift register 41 takes in a level of signal ACT in response to each rising edge of clock signal intCK or /intCK, and outputs the taken-in level of signal ACT, in response to a succeeding rising edge. An output signal from shift register 41 becomes signal CDE.

Figure 11:
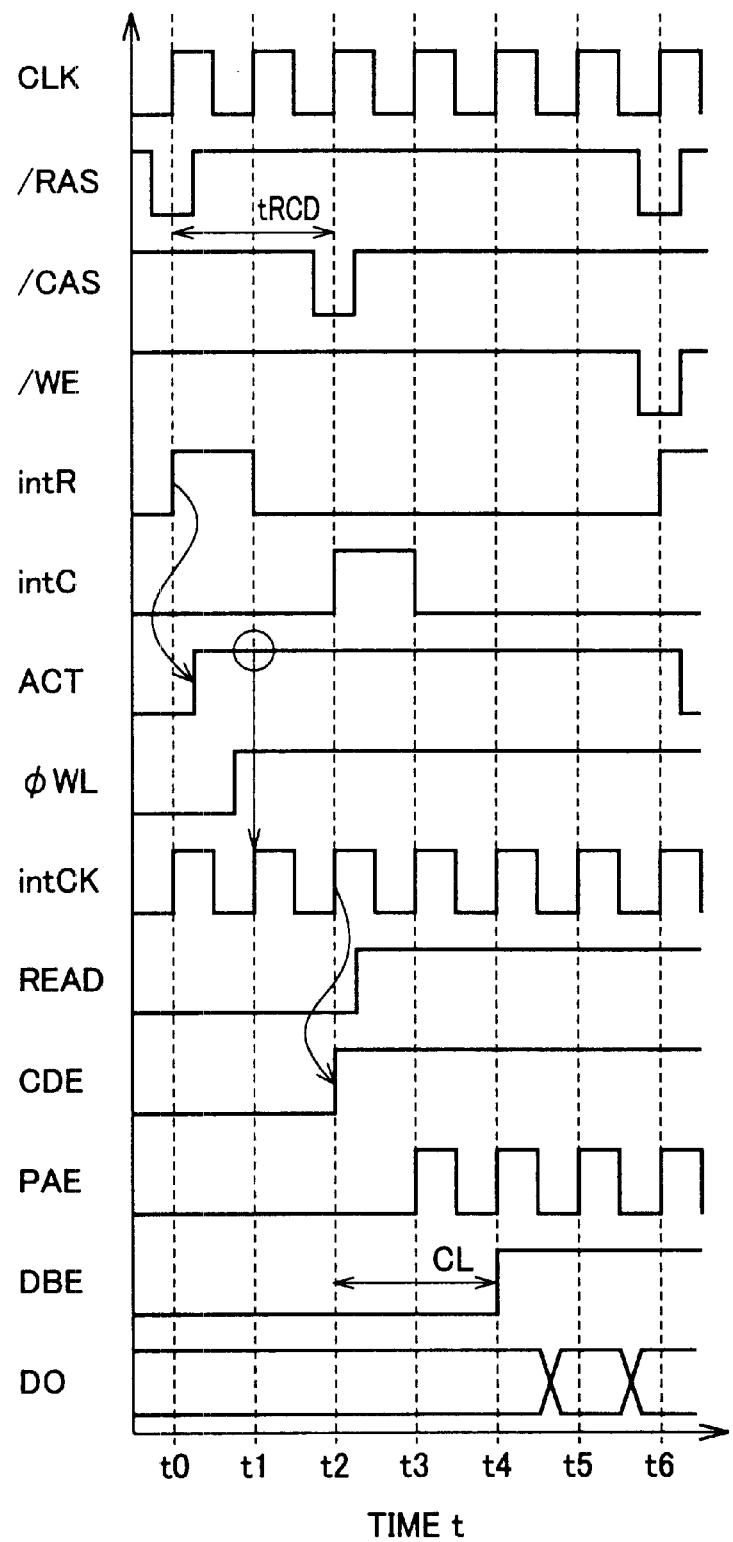
FIG. 11 is a timing chart showing a read operation in a case where a period of a clock signal of the SDRAM shown in FIG. 10 is relatively short.

FIG. 11 is a timing chart showing read control of the SDRAM when period TCLK of clock signal CLK is relatively short (for instance, TCLK=8 ns). In this case, signal φSW is set to the "H" level, and clock signal intCK is input to the clock terminal of shift register 41. In FIG. 11, when an active command is input at a time t0, signal ACT rises to the "H" level. In response to a rising edge (time t1) of clock signal intCK that immediately follows a rising edge of signal ACT, the level of signal ACT is taken into shift register 41, and signal CDE rises to the "H" level in response to a succeeding rising edge (time t2) of clock signal intCK.

Moreover, a read command is input in synchronization with the rising edge of clock signal CLK that comes two clock cycles after the input of the active command, and signal READ rises to the "H" level. In response to the second rising edge (time t4) of clock signal CLK after signal CDE rises to the "H" level, signal DBE rises to the "H" level, and a prescribed number of read data signals DO are output successively in synchronization with clock signal CLK.

Figure 12:
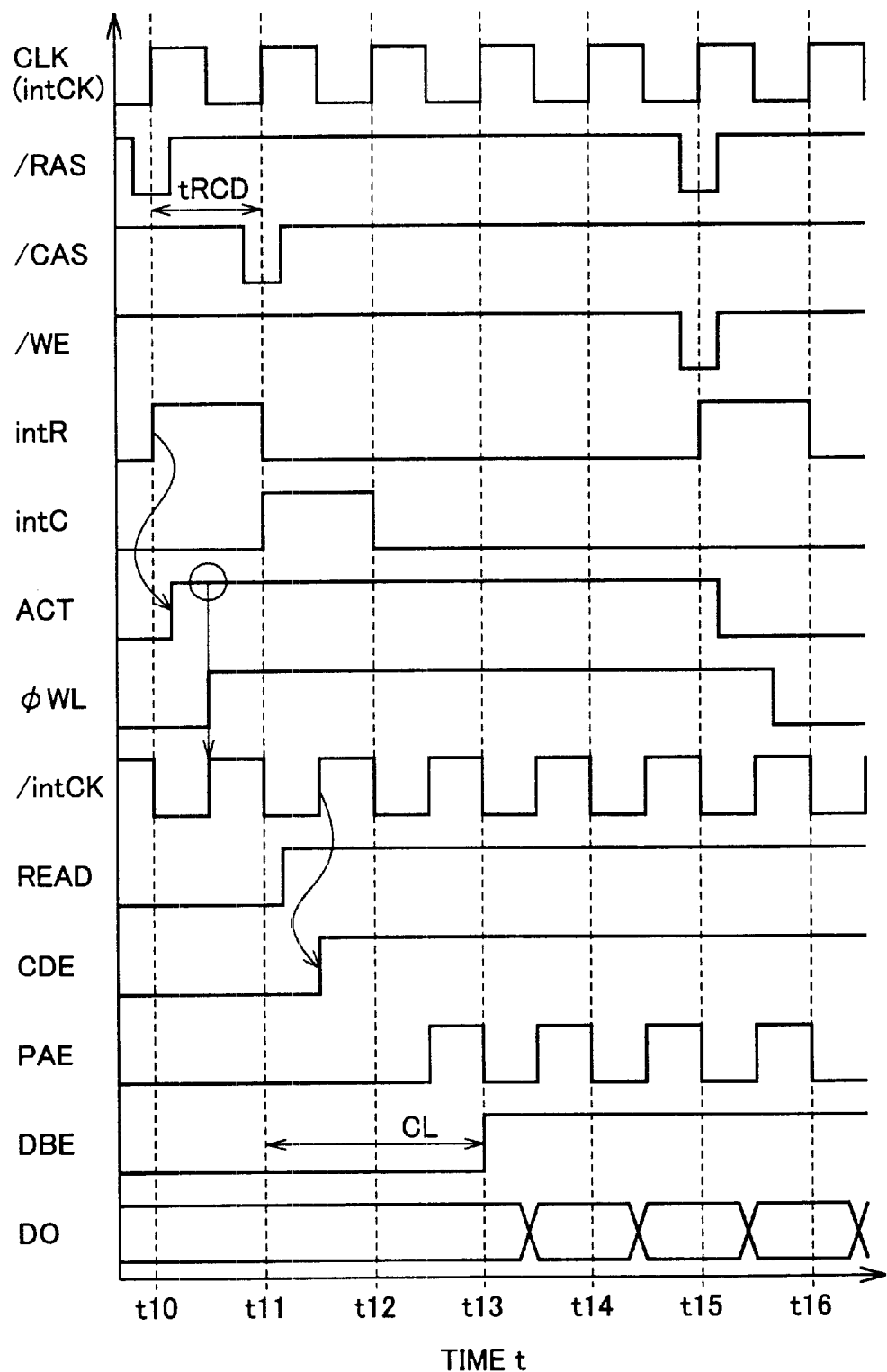
FIG. 12 is a timing chart showing a read operation in a case where the period of the clock signal of the SDRAM shown in FIG. 10 is relatively long.

FIG. 12 is a timing chart showing read control of the SDRAM when period TCLK of clock signal CLK is relatively long (for instance, TCLK=12 ns). In this case, signal φSW is set to the "L" level, and clock signal /intCK is input to the clock terminal of shift register 41. In FIG. 12, when the active command is input at a time t10, signal ACT rises to the "H" level. In response to a rising edge of clock signal /intCK that immediately follows a rising edge of signal ACT, a level of signal ACT is taken into shift register 41, and signal CDE rises to the "H" level in response to a succeeding rising edge of clock signal /intCK. Moreover, the read command is input in synchronization with the rising edge of clock signal CLK that comes one clock cycle after the input of the active command, and signal READ rises to the "H" level. In response to the second rising edge (time t13) of clock signal CLK after signal CDE rises to the "H" level, signal DBE rises to the "H" level, and a prescribed number of read data signals DO are successively output in synchronization with clock signal CLK.

Figure 13:
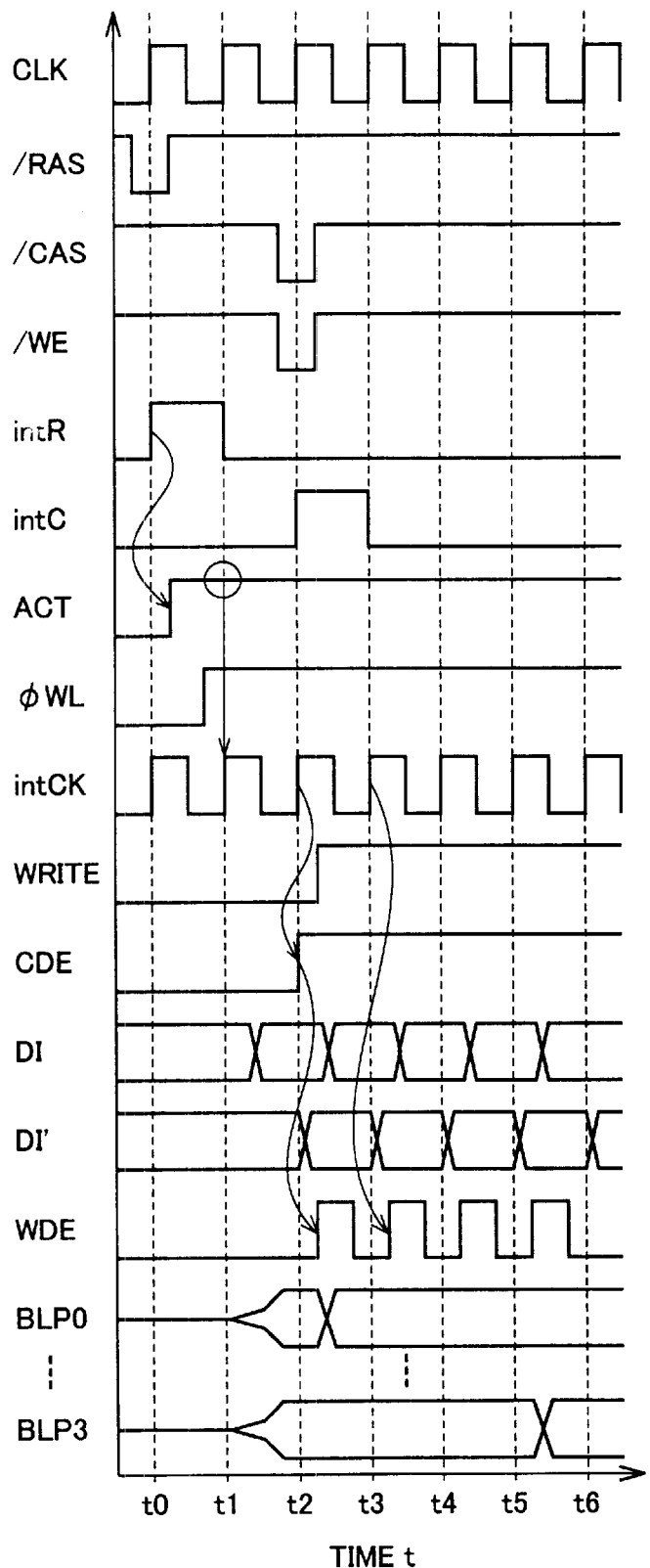
FIG. 13 is a timing chart showing a write operation in a case where the period of the clock signal of the SDRAM shown in FIG. 10 is relatively short.

FIG. 13 is a timing chart showing write control of the SDRAM when period TCLK of clock signal CLK is relatively short (for instance, TCLK=8 ns). In this case, signal φSW is set to the "H" level, and clock signal intCK is input to the clock terminal of shift register 41.

In FIG. 13, when an active command (/RAS=L, /CAS=H, /WE=H) is input in synchronization with a rising edge (time t0) of clock signal CLK, internal control signals intR, intC, intW respectively attain the "H" level, the "L" level, and the "L" level, and accordingly, signal ACT rises to the "H" level.

When signal ACT rises to the "H" level, the equalizing operation of a bit line pair BLP (BL, /BL) is interrupted, and a word line WL designated by row address signals RA0 to RAi rises to the "H" level, and sense amplifier 15 is activated.

In response to a rising edge (time t1) of clock signal intCK that immediately follows a rising edge of signal ACT, a level of signal ACT is taken into shift register 41, and signal CDE rises to the "H" level in response to a succeeding rising edge (time t2) of clock signal intCK.

Moreover, a write command (/RAS=H, /CAS=L, /WE=L) is input in synchronization with the rising edge (time t2) of clock signal CLK that comes two clock cycles after the input of the active command, and signal WRITE rises to the "H" level. When signals CDE and WRITE both attain the "H" level, a prescribed number (for instance, four) of column select lines CSL designated by column address signals CA0 to CAi each rise to the "H" level for one clock cycle sequentially. Column address signals of the second column select line CSL and beyond are generated inside the SDRAM based on column address signals CA0 to CAi of the first column select line CSL.

In addition, along with the input of the active command, a prescribed number (in this case, four) of external data signals DI are successively input in synchronization with a rising edge of clock signal CLK, and are successively latched by latch circuit 29. An output signal DI' of latch circuit 29 is supplied to write driver 18 via data bus DB.

On the other hand, signals CDE and WRITE attain the "H" level. In response to a rising edge of clock signal intCK, write driver activating signal WDE rises to the "H" level only a prescribed number of times (in this case, only four times). Consequently, four data signals DI' are successively written into the selected four bit line pairs BLP0 to BLP3.

Figure 14:
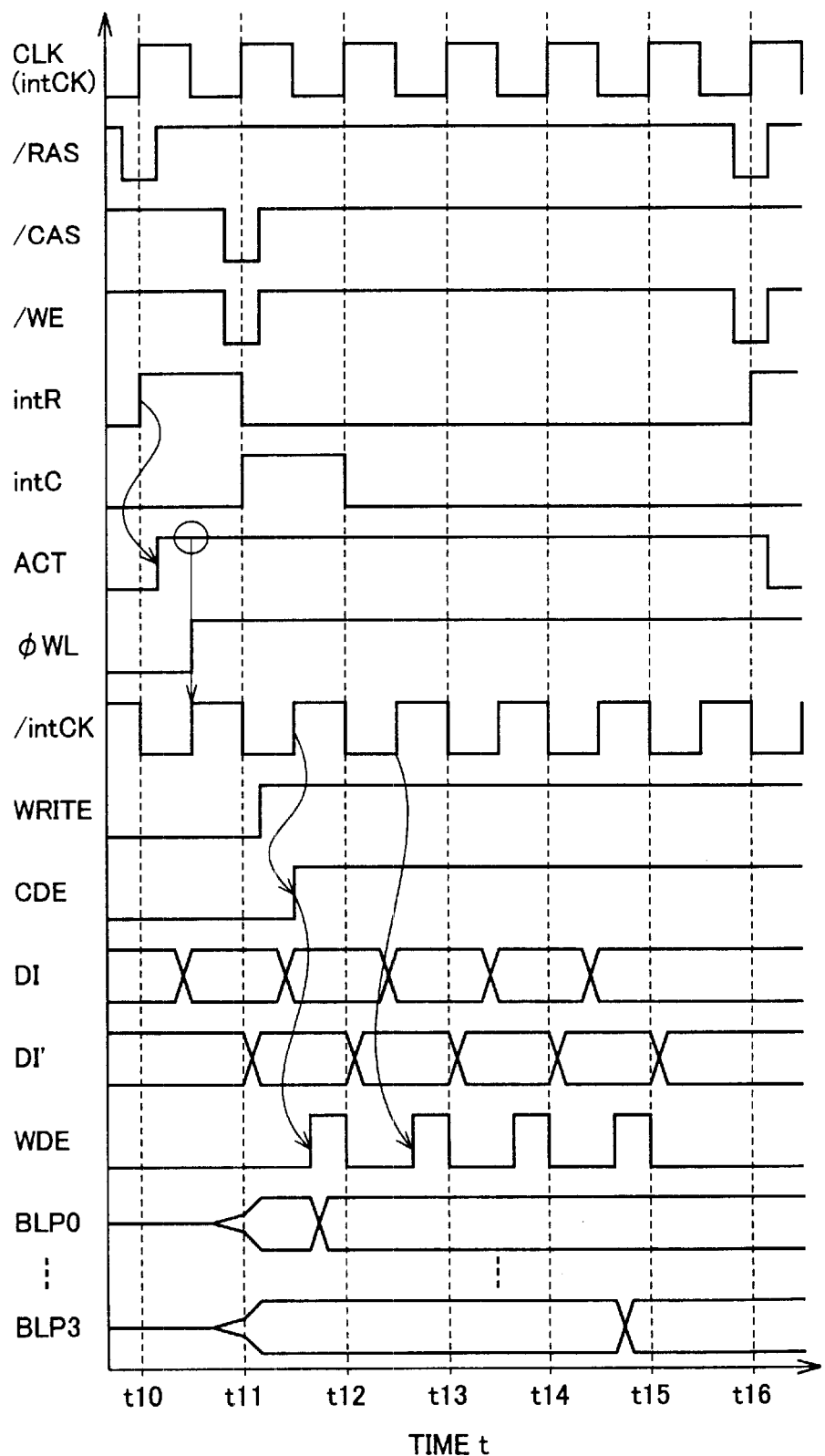
FIG. 14 is a timing chart showing a write operation in a case where the period of the clock signal of the SDRAM shown in FIG. 10 is relatively long.
Figure 15:
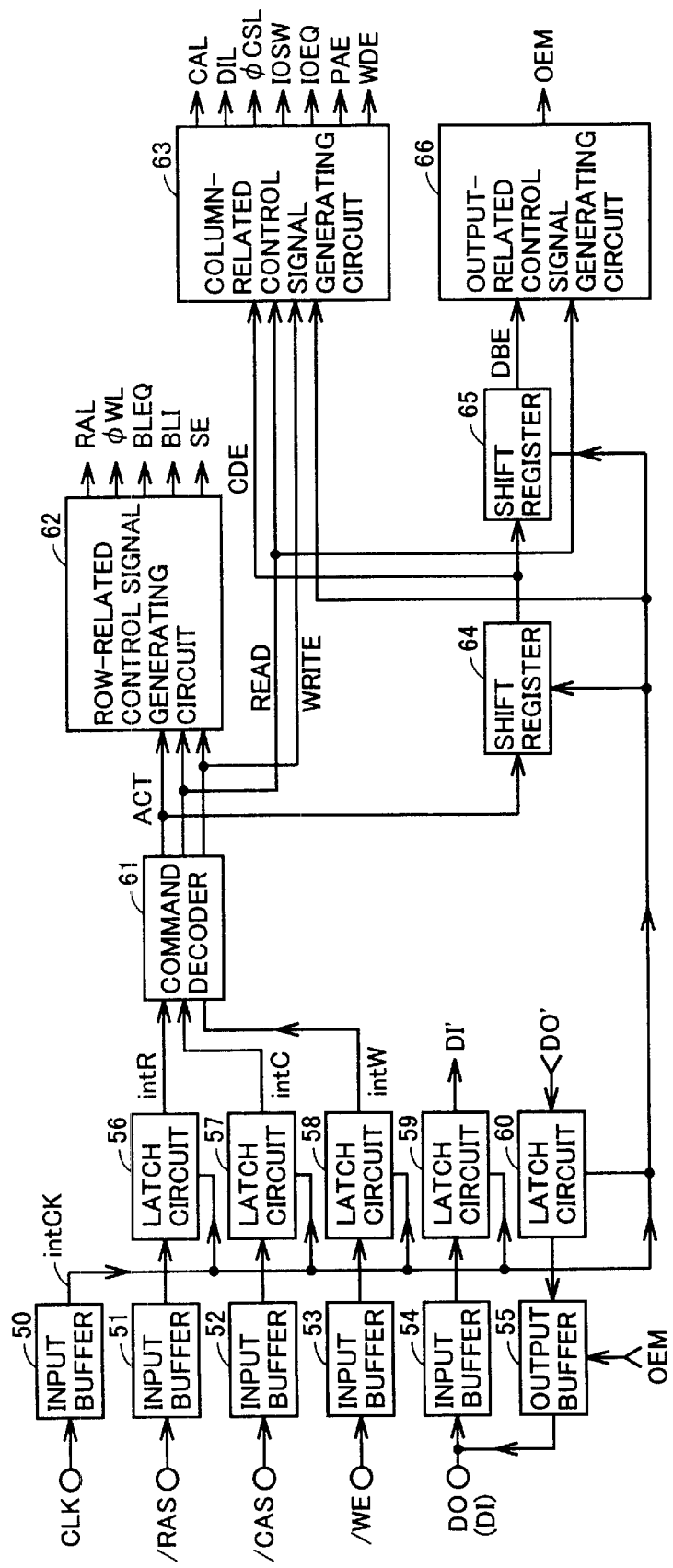
FIG. 15 is a block diagram representing an arrangement of a portion related to read/write control of a conventional SDRAM.
Figure 16:
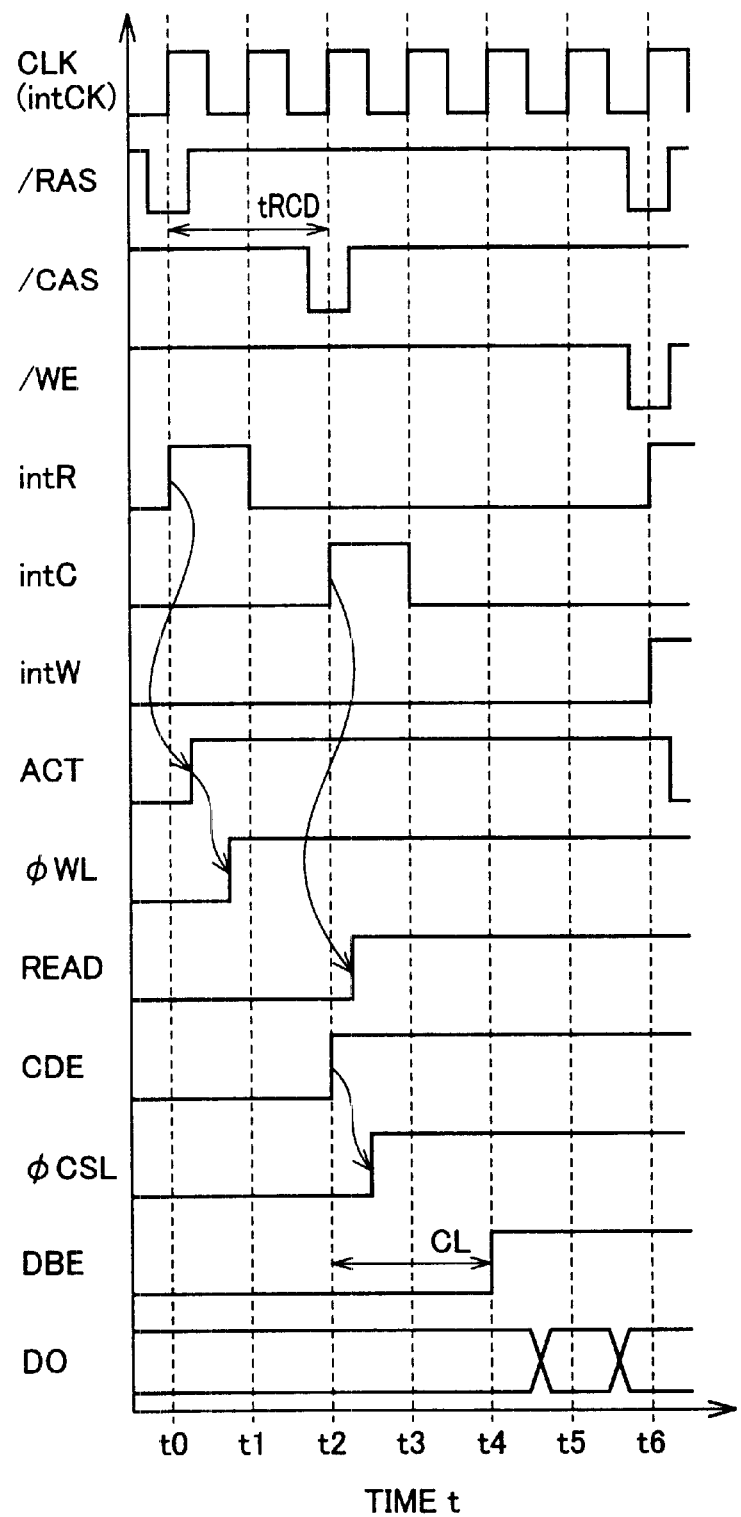
FIG. 16 is a timing chart showing a read operation in a case where a period of a clock signal of the SDRAM shown in FIG. 15 is relatively short.
Figure 17:
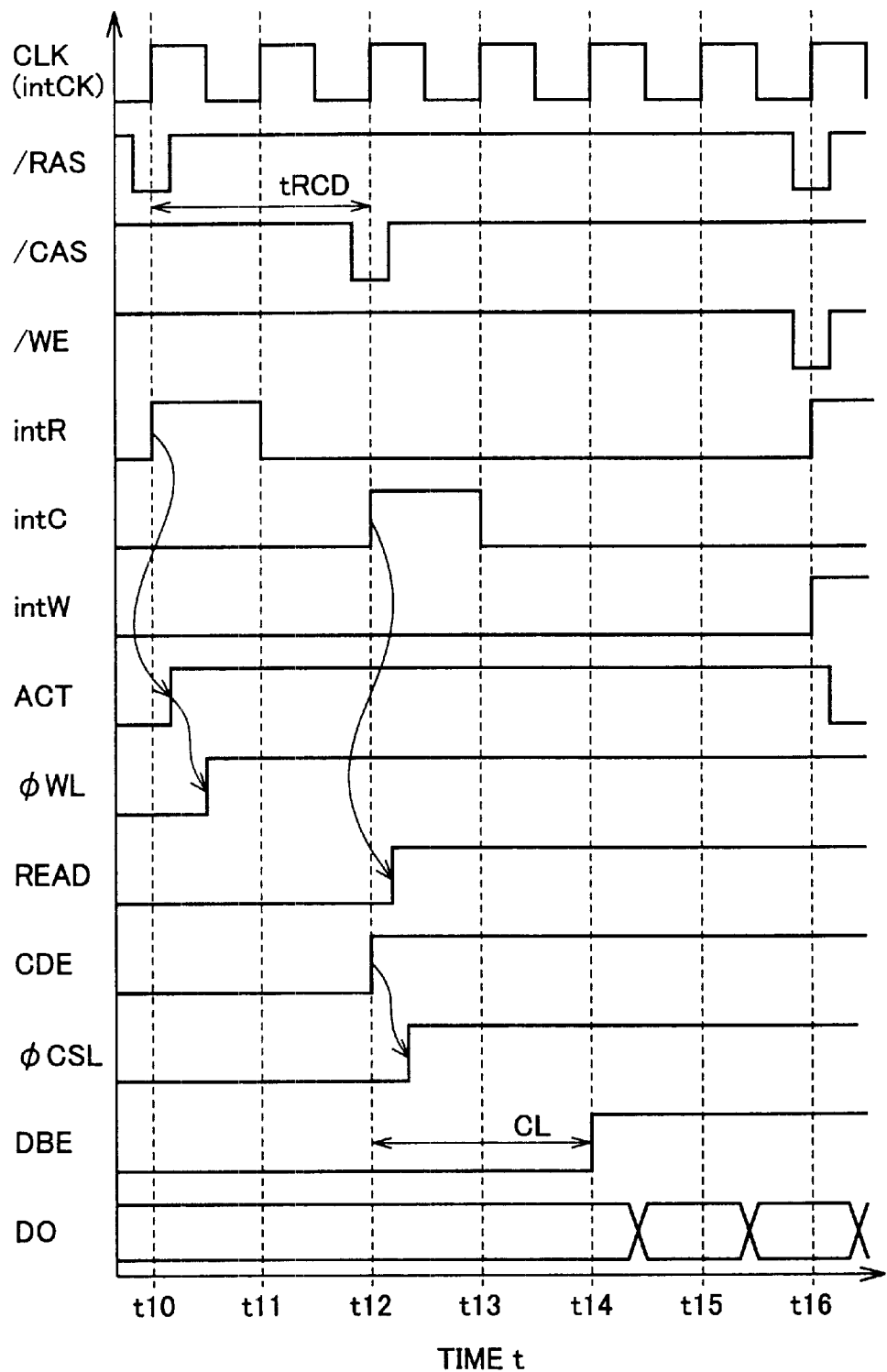
FIG. 17 is a timing chart showing a read operation in a case where the period of the clock signal of the SDRAM shown in FIG. 15 is relatively long.

FIG. 14 is a timing chart showing write control of the SDRAM when period TCLK of clock signal CLK is relatively long (for instance, TCLK=12 ns). In this case, signal φSW is set to the "L" level, and clock signal /intCK is input to the clock terminal of shift register 41.

In FIG. 14, an active command is input in synchronization with a rising edge (time t10) of clock signal CLK, and a signal ACT rises to the "H" level. When signal ACT rises to the "H" level, the equalizing operation of a bit line pair BLP (BL, /BL) is interrupted, and a word line WL rises to the "H" level, and a sense amplifier 15 is activated.

In response to a rising edge of clock signal intCK immediately following a rising edge of signal ACT, a level of signal ACT is taken into shift register 41, and a signal CDE rises to the "H" level in response to a succeeding rising edge of clock signal intCK.

Moreover, a write command is input in synchronization with the rising edge (time t2) of clock signal CLK that comes one clock cycle after the input of the active command, and a signal WRITE rises to the "H" level. When signals CDE and WRITE both attain the "H" level, a prescribed number of column select lines CSL designated by column address signals CA0 to CAi each rise to the "H" level each for one clock cycle sequentially.

In addition, along with the input of the active command, a prescribed number of external data signals DI are successively input in synchronization with a rising edge of clock signal CLK, and are latched successively in latch circuit 29. An output signal DI' of latch circuit 29 is supplied to write driver 18 via data bus DB.

On the other hand, when signals CDE and WRITE attain the "H" level, write driver activating signal WDE rises to the "H" level in a pulse-like manner a prescribed number of times in response to a rising edge of clock signal intCK. Consequently, four data signals DI' are successively written into the selected four bit line pairs BLP0 to BLP3.

The same effects as those obtained by the first embodiment can be achieved by the third embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device that operates in synchronization with a clock signal, comprising:

an input circuit for taking in a plurality of external control signals in response to said clock signal changing from a first level to a second level;

a decoder for selectively causing a first or second internal control signal to attain an active level according to the plurality of external control signals taken into said input circuit;

a signal generating circuit for causing a third internal control signal to attain an active level in response to a predetermined time period having elapsed since said first internal control signal attained the active level and in response to a level of said clock signal changing; and a read/write circuit for performing part of a data read/write operation in response to said first internal control signal attaining the active level and for performing rest of said data read/write operation in response to said second and third internal control signals both attaining the active level.

2. The semiconductor memory device according to claim 1, wherein said signal generating circuit includes a delay circuit for delaying said first internal control signal for said predetermined time period, a pulse generating circuit for outputting a pulse signal every time the level of said clock signal changes, and a latch circuit for latching an output signal of said delay circuit in response to each pulse signal, and wherein an output signal of said latch circuit becomes said third internal control signal.

3. A semiconductor memory device that operates in synchronization with a clock signal, comprising:

an input circuit for taking in a plurality of external control signals in response to said clock signal changing from a first level to a second level;

a decoder for selectively causing a first or second internal control signal to attain an active level according to the plurality of external control signals taken into said input circuit;

a signal generating circuit for causing a third internal control signal to attain an active level in response to said clock signal changing from said second level to said first level after said second internal control signal attains the active level; and a read/write circuit for performing part of a data read/write operation in response to said first internal control signal attaining the active level and for performing rest of said data read/write operation in response to said second and third internal control signals both attaining the active level.

4. The semiconductor memory device according to claim 3, wherein said signal generating circuit includes an inverter for receiving said clock signal and outputting an inverted clock signal, and a latch circuit for latching said second internal control signal in response to said inverted clock signal changing from said first level to said second level, and wherein an output signal of said latch circuit becomes said third internal control signal.

5. A semiconductor memory device that operates in synchronization with a clock signal, comprising:

an input circuit for taking in a plurality of external control signals in response to said clock signal changing from a first level to a second level;

a decoder for selectively causing a first or second internal control signal to attain an active level according to the plurality of external control signals taken into said input circuit;

a signal generating circuit for causing a third internal control signal to attain an active level in response to said clock signal having changed from said second level to said first level a predetermined number of times after said first internal control signal attained the active level; and a read/write circuit for performing part of a data read/write operation in response to said first internal control signal attaining the active level and for performing rest of said data read/write operation in response to said second and third internal control signals both attaining the active level.

6. The semiconductor memory device according to claim 5, wherein said signal generating circuit includes an inverter for receiving said clock signal and outputting an inverted clock signal, and a shift register for taking in a level of said first internal control signal and outputting the level of said first internal control signal previously taken in, every time said inverted clock signal changes from said first level to said second level, and wherein an output signal of said shift register becomes said third internal control signal.

7. The semiconductor memory device according to claim 5, further comprising:

a setting circuit for selectively setting a fourth internal control signal to an active level or to an inactive level from outside, wherein said signal generating circuit causes said third internal control signal to attain an active level in response to said clock signal having changed from said second level to said first level said predetermined number of times when said fourth internal control signal is at the active level, and causes said third internal control signal to attain the active level in response to said clock signal having changed from said first level to said second level said predetermined number of times when said fourth internal control signal is at the inactive level.

8. The semiconductor memory device according to claim 7, wherein said signal generating circuit includes an inverter for receiving said clock signal and outputting an inverted clock signal, a gate circuit for receiving said clock signal and said inverted clock signal and for allowing said inverted clock signal to pass through when said fourth internal control signal is at the active level, while allowing said clock signal to pass through when said fourth internal control signal is at the inactive level, and a shift register for taking in a level of said first internal control signal and outputting the level of said first internal control signal previously taken in, every time said inverted clock signal or said clock signal that passes through said gate circuit changes from said first level to said second level, and wherein an output signal of said shift register becomes said third internal control signal.

* * * * *

UNITED STATES PATENT AND TRADEMARK OFFICE
CERTIFICATE OF CORRECTION

PATENT NO.     : 6,456,563 B1
DATED          : September 24, 2002
INVENTOR(S)    : Takeshi Kajimoto It is certified that error appears in the above-identified patent and that said Letters Patent is hereby corrected as shown below:

<u>Title page,</u>
Item [54], Title, replace "SYCHRONIZATION" with -- SYNCHRONIZATION--

Signed and Sealed this

Eighteenth Day of March, 2003

JAMES E. ROGAN
*Director of the United States Patent and Trademark Office*